(12) United States Patent
Wajima

(10) Patent No.: US 6,369,335 B1
(45) Date of Patent: Apr. 9, 2002

(54) MOTHER SUBSTRATE, SUBSTRATE ELEMENT AND METHOD FOR MANUFACTURING THE SAME

(75) Inventor: Masaya Wajima, Shinminato (JP)

(73) Assignee: Murata Manufacturing Co., Ltd, Kyoto (JP)

( * ) Notice: Subject to any disclaimer, the term of this patent is extended or adjusted under 35 U.S.C. 154(b) by 0 days.

(21) Appl. No.: 09/525,075

(22) Filed: Mar. 14, 2000

(30) Foreign Application Priority Data

Apr. 2, 1999 (JP) .......................................... 11-095951

(51) Int. Cl.$^7$ ................................................ H01N 9/09
(52) U.S. Cl. .................... 174/262; 174/261; 29/836; 361/772; 438/113
(58) Field of Search .................. 361/748, 772; 438/113; 29/830, 831, 827, 25.35; 174/250, 262, 261; 301/736

(56) References Cited

U.S. PATENT DOCUMENTS 5,671,531 A * 9/1997 Mugiya ........................ 29/827
5,796,586 A * 8/1998 Lee et al. .................... 361/748
5,847,930 A * 12/1998 Kazle .......................... 361/736
5,854,741 A * 12/1998 Shim et al. .................. 361/813

FOREIGN PATENT DOCUMENTS

JP 7-335995 12/1995

* cited by examiner

Primary Examiner—Albert W. Paladini
(74) Attorney, Agent, or Firm—Keating & Bennett, LLP

(57) ABSTRACT

A method for manufacturing substrate elements includes providing a mother substrate, forming at least one elongated through-hole on the mother substrate such that an entire longitudinal end surface of the first substrate element and a portion of a lateral surface of the second substrate element are exposed, forming an electrode pattern on the inner surface of the at least one elongated through-hole, and cutting the mother substrate along lines extending in the vicinity of the longitudinal ends of the at least one elongated through-hole and in a direction that is substantially perpendicular to the longitudinal axis of the elongated through-hole.

20 Claims, 14 Drawing Sheets

MOTHER SUBSTRATE, SUBSTRATE ELEMENT AND METHOD FOR MANUFACTURING THE SAME

BACKGROUND OF THE INVENTION

1. Field of the Invention

The present invention relates to mother substrates, substrate elements, and methods for manufacturing the same. In particular, the present invention relates to a mother substrate used for manufacturing individual substrate elements including electronic device elements such as resonators and filters.

2. Description of the Related Art

Known technologies related to the present invention are disclosed in, for example, Japanese Unexamined Patent Application Publication Nos. 8-293752, 58-139513, 8-97674, and 7-335995.

A conventional method for manufacturing substrates in which a mother substrate is provided with electrode patterns and the mother substrate is cut into a plurality of individual substrate elements has been widely used. In the conventional method, a mother substrate 1 shown in FIG. 22 is used. The mother substrate 1 shown in FIG. 22 is provided with through-holes 4 at positions corresponding to the four corners and to a portion of each lateral side of a substrate element to be formed. Each through-hole 4 is provided with an electrode 2 on the inner surface thereof (see FIG. 23). The mother substrate 1 is cut along cut lines D by a dicer or similar cutting apparatuses into substrate elements, such as a substrate element 3 shown in FIG. 23.

However, in the conventional method, a problem exists in that a plurality of molds, for forming the mother substrates 1, are required to be provided with pins according to the number of through-holes 4 of the substrate elements 3, thereby increasing the cost of the molds, and consequently increasing the manufacturing costs of the substrate elements 3. Moreover, in the method in which the mother substrate 1 is provided with a plurality of the through-holes 4 at the lateral surfaces of the substrate elements 3, short circuits between the electrodes 2 and cracking of substrates are likely to occur when the through-holes 4 are excessively close to each other, whereby miniaturization of the substrate elements 3 is prevented.

SUMMARY OF THE INVENTION

In order to overcome the problems described above, preferred embodiments of the present invention provide an apparatus and method for efficiently manufacturing mother substrates and miniaturized substrate elements.

In a preferred embodiment of the present invention, a mother substrate for forming a plurality of substrate elements having electrodes on the lateral side surfaces and the longitudinal end surfaces thereof includes a region in which the plurality of substrate elements are provided, the region including at least one elongated through-hole. The elongated through-hole is located in the region such that an entire longitudinal end surface of a first substrate element and a portion of a lateral side surface of a second substrate element are exposed.

In the mother substrate, the elongated through-hole may be located at the inner surface of a longitudinal end that is flush with a lateral side surface of the second substrate element. The inner surface of a longitudinal end of the through-hole may also be provided with the side surface electrode.

According to another preferred embodiment of the present invention, a substrate element having electrodes on a lateral surface thereof and a longitudinal end surface thereof, is manufactured by a method including the steps of providing a mother substrate, forming at least one elongated through-hole such that an entire longitudinal end surface of the first substrate element and a portion of a lateral surface of the second substrate element are exposed, forming an electrode pattern on the inner surface of the at least one elongated through-hole, and cutting the mother substrate along lines extending in the vicinity of the longitudinal ends of the at least one elongated through-hole and in a direction that is substantially perpendicular to the longitudinal axis of the elongated through-hole.

According to another preferred embodiment of the present invention, an electronic device includes a substrate element having electrodes on a lateral surface thereof and a longitudinal end surface thereof, manufactured by a method including the steps of providing a mother substrate, forming at least one elongated through-hole on the mother substrate such that an entire longitudinal end surface of a first substrate element and a part of a lateral surface of a second substrate element are exposed, the first and the second substrate elements being adjacent to each other and having a common lateral surface thereof, forming an electrode on an inner surface of the at least one elongated through-hole to define an end surface electrode of the first substrate element and a side surface electrode of the second substrate element, cutting the mother substrate along lines extending in a vicinity of the longitudinal ends of the at least one elongated through-hole and in a direction that is substantially perpendicular to the longitudinal axis of the at least one elongated through-hole, and an electronic device element mounted on the substrate element.

In preferred embodiments of the present invention, an elongated through-hole is preferably provided in a mother substrate so that an entire longitudinal end surface of a first substrate element and a portion of a lateral surface of a second substrate element are simultaneously exposed, in which the first and the second substrate elements are adjacent to each other and have a common lateral surface thereof. By forming an electrode on the inner surface of the elongated through-hole, an end surface electrode of the first substrate element and a side surface electrode of the second substrate element are easily formed simultaneously. With this arrangement, the number of through-holes can be reduced compared to a conventional method, thereby reducing the manufacturing cost of substrates. Moreover, by reducing the number of through-holes compared to a known mother substrate, problems such as the strength of the substrate being decreased by adjacent through-holes being excessively close to each other is prevented. Therefore substrate elements according to preferred embodiments of the present invention are greatly miniaturized.

Other features, elements and advantages of the present invention will be described in detail below with reference to preferred embodiments of the present invention and the attached drawings.

BRIEF DESCRIPTION OF THE ATTACHED DRAWINGS

The present invention will become more fully understood from the detailed description given herein below and the accompanying drawings which are given by way of illustration only, and thus do not limit the present invention and wherein.

DETAILED DESCRIPTION OF PREFERRED EMBODIMENTS

Figure 1:
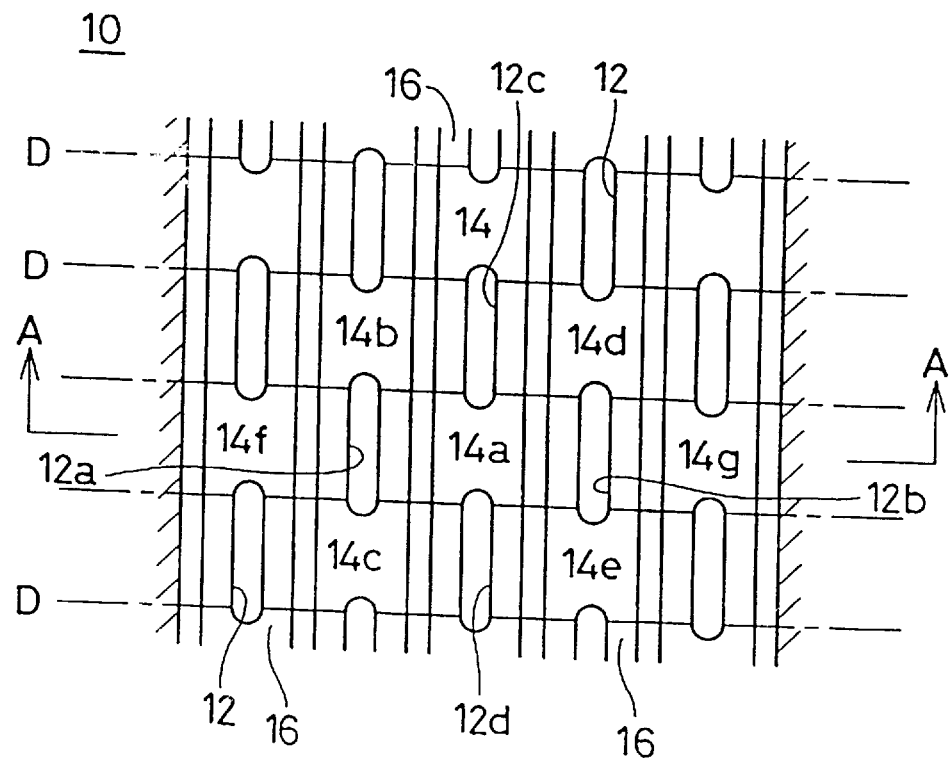
FIG. 1 is a plan view of a mother substrate according to a first preferred embodiment of the present invention.
Figure 2:
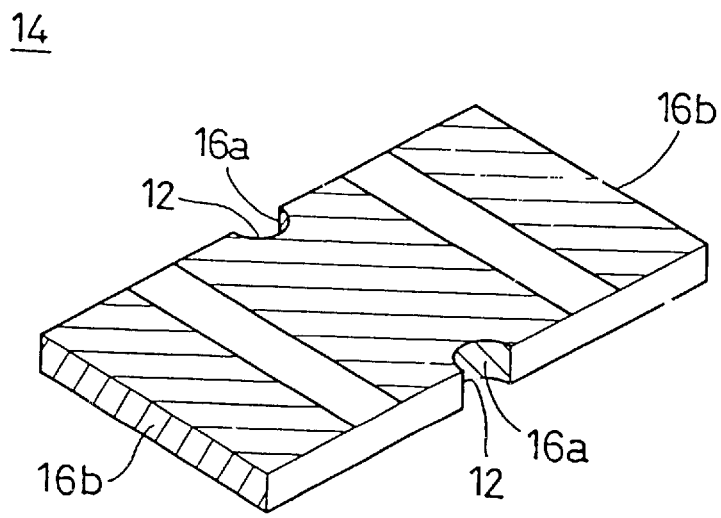
FIG. 2 is a perspective view of a substrate element obtained from the mother substrate shown in FIG. 1.
Figure 3:
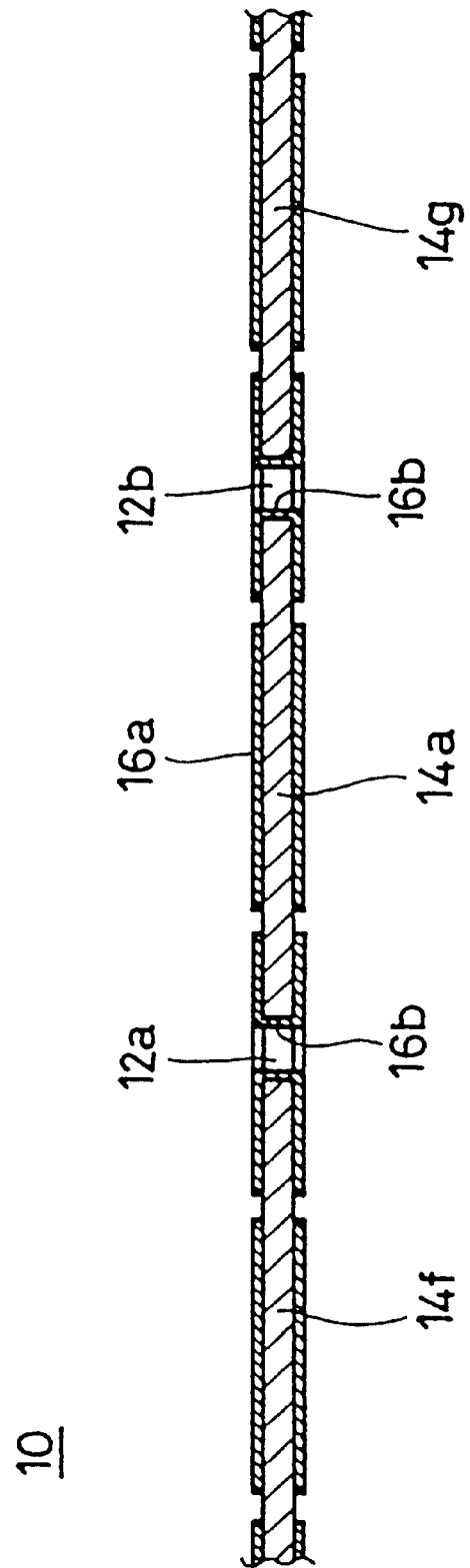
FIG. 3 is a cross-sectional view, along the line A—A, of the mother substrate shown in FIG. 1.

FIG. 1 is a plan view of a mother substrate according to a first preferred embodiment of the present invention. FIG. 2 is a perspective view of a substrate element obtained from the mother substrate shown in FIG. 1. FIG. 3 is a cross-sectional view, along the line A—A, of the mother substrate shown in FIG. 1.

A mother substrate 10 according to the first preferred embodiment preferably has a substantially rectangular shape. The mother substrate 10 is cut into a plurality of substrate elements 14, as described below. The mother substrate 10 may be made of either a synthetic resin or a dielectric substance or other suitable material.

The mother substrate 10 is provided with a plurality of elongated through-holes 12 extending substantially parallel to each other at a predetermined distance from each other. The through-holes 12 are provided at each of the longitudinal ends, which oppose each other, of the substrate element 14. The through-holes 12 preferably extend in a width direction of the substrate element 14. The through-holes 12 are disposed in a staggered manner so that a continuous slit is not provided in the substrate elements 14. The through-holes 12 may be formed either by forming the mother substrate 10 using a mold having a plurality of protrusions or by machining the prepared mother substrate 10.

The configuration of the mother substrate 10 is described as follows, from the viewpoint of a substrate element 14a. Substrate elements 14b, 14c, 14d, and 14e are disposed around the substrate element 14a, each having a portion of a lateral surface in common with a lateral surface of the substrate element 14a. The opposing longitudinal ends of the substrate element 14a oppose substrate elements 14f and 14g across through-holes 12a and 12b, respectively. The through-hole 12a opposing one of the longitudinal ends of the substrate element 14a is elongated to provide, by the ends of the through-hole 12a, substantially U-shaped recesses exposing intermediate parts of lateral surfaces of the substrate elements 14b and 14c. The through-hole 12b opposing the other longitudinal end of the substrate element 14a is also elongated to provide, by the ends of the through-hole 12b, substantially U-shaped recesses exposing intermediate parts of lateral surfaces of the substrate elements 14d and 14e. The through-hole 12c between the substrate elements 14b and 14d is elongated to provide, by an end thereof, a substantially U-shaped recess exposing an intermediate portion of one of the lateral surfaces, which are opposed in a width direction, of the substrate element 14a. The through-hole 12d between the substrate elements 14c and 14e is elongated to provide, by an end thereof, a substantially U-shaped recess exposing an intermediate portion of the other one of the lateral surfaces, which are opposed in a width direction, of the substrate element 14a. In the same manner, the other ends of the through-holes 12c and 12d provide substantially U-shaped recesses exposing intermediate portions of lateral surfaces of other substrate elements. The recesses in the lateral surfaces of the substrate elements 14 define through-holes of each substrate element 14 and the surface of each recess has a side surface electrode 16a as described below.

A plurality of zonal electrode patterns 16 extending substantially parallel along the through-holes 12 are provided on the principal plane of the mother substrate 10. The electrode patterns 16 are also provided on the inner surfaces of the through-holes 12. The electrode patterns 16 on the principal plane of the mother substrate 10 and the electrode patterns 16 on the inner surfaces of the through-holes 12 are electrically connected with each other. The electrode patterns 16 on the inner surfaces of the through-holes 12 define the side surface electrodes 16a and end surface electrodes 16b of the substrate elements 14. That is, the electrode patterns 16 provided on the inner surfaces of the longitudinal ends of the elongated through-holes 12 define the side surface electrodes 16a of the substrate elements 14, and the electrode patterns 16 provided on the remaining surfaces of the elongated through-holes 12 define the end surface electrodes 16b of the substrate elements 14. The side surface electrodes 16a and the end surface electrodes 16b define input/output electrodes or a grounding electrode of an electronic device. The electrode patterns 16 are preferably formed by a method or by combined methods selected, according to the material of the substrate and the usage of the substrate, from methods such as printing, sintering, evaporating, and plating or other suitable processes.

One of the methods for forming the electrode patterns 16 is described below. Before forming electrode patterns 16, the outer surface of the mother substrate 10 is activated by roughening the surface with a solvent, an acid, an alkali, or other suitable substances, or by coating the surface with a catalyst for plating.

A metallic film is deposited on the entire surface of the mother substrate 10 by electroless-plating copper on the surface. The metallic film is deposited also to cover the inner surfaces of the through-holes 12.

The material of the metallic film may be, besides copper, made from silver, gold, palladium, and aluminum, or a preferable alloy thereof. The metallic film may be overlaid, as needed, with another metallic film of these materials via electroplating.

A resist film is coated on the entire surface of the mother substrate 10 having the metallic film. The resist film covers substantially the entire outer surface of the metallic film.

A mask having a plurality of openings is provided on the mother substrate 10. The openings are arranged to be associated with the portions of the substrate element, as a final product, in which electrodes will not be formed.

Then, diffused beams are applied to the mask, and the resist film under the openings of the mask is exposed. In this case, the inner surfaces of the through-holes 12 are also exposed to the beams which are applied in a diffused manner. The diffused beams are obtained by an appropriate diffuser disposed between a light source and the mask, by moving the light source so as to oppose the mask and the mother substrate 10, or by moving the mask and the mother substrate 10 so as to oppose the light source. For this purpose, a commercial scanning-type exposure apparatus, for example, is used.

The resist layer is developed, and the exposed portion of the resist layer is removed by using a strong acid such as nitric acid. Then, the metallic film is removed by etching in the portion in which the resist layer is removed. The remaining portions of the resist layer which have not been exposed and have not been etched are removed by a solvent having, for example, about 65% by weight aromatic hydrocarbon, about 20% by weight alkyl sulfonic acid, and about 15% by weight alkyl hydroxybenzene. Thus, the electrode patterns 16 are formed on the mother substrate 10.

The plurality of cut lines D shown by chain lines on the mother substrate 10 shown in FIG. 1 extend substantially parallel to each other at the same distance as the width of each substrate element 14. The plurality of cut lines D extend in a direction that is substantially perpendicular to the longitudinal axis of the through-holes 12. The cut lines D intersect each through-hole 12 at sections disposed slightly toward the intermediate portion from each end of the through-hole 12. The mother substrate 10 is cut along the cut lines D by a dicer or by other suitable cutting apparatus, whereby the mother substrate 10 is horizontally divided into pieces along the plurality of cut lines D and vertically by the plurality of through-holes 12, thereby providing a plurality of the substrate elements 14. The plurality of substrate elements 14 may be obtained only by cutting the mother substrate 10 along lines that are substantially perpendicular to the longitudinal axis of the through-holes 12, instead of cutting the mother substrate 10 in both horizontal and vertical directions, as in the conventional method. Each of the substrate elements 14 preferably includes the side surface electrodes 16a on the inner surfaces of the through-holes 12, which are substantially U-shaped recesses, provided in the lateral surfaces of the substrate element 14, which oppose each other in the width direction, and includes the end surface electrodes 16b disposed along the entire surfaces of the ends of the substrate element 14, which oppose each other longitudinally. Apart from the dicer and associated process described above, the mother substrate 10 may be cut by any known cutting method or apparatus.

According to the present preferred embodiment, the substrate elements 14, as a final product, can be obtained by cutting the mother substrate 10 having the plurality of elongated through-holes 12, the through-holes 12 including the electrode patterns 16 provided on the inner surfaces thereof to define the end surface electrodes 16b and the side surface electrodes 16a of the substrate elements 14. With this arrangement, manufacturing time can be reduced in comparison to that which is required in the conventional manufacturing method, and the substrate elements 14 can be efficiently produced.

In the mother substrate 10 according to the present preferred embodiment, the number of through-holes 12 can be reduced by approximately 30% from that which is provided in the conventional mother substrate in which six through-holes must be formed. In contrast, in the mother substrate 10, four elongated through-holes 12 are preferably provided for one of the substrate elements 14 to obtain the substrate elements 14 of the same configuration as that of the known substrate. The end surface electrodes 16b and the side surface electrodes 16a are provided respectively at the longitudinal ends and at the lateral ends of each substrate element 14. With this arrangement, the molding cost and the manufacturing cost of the mother substrate 10 are greatly reduced.

Figure 4:
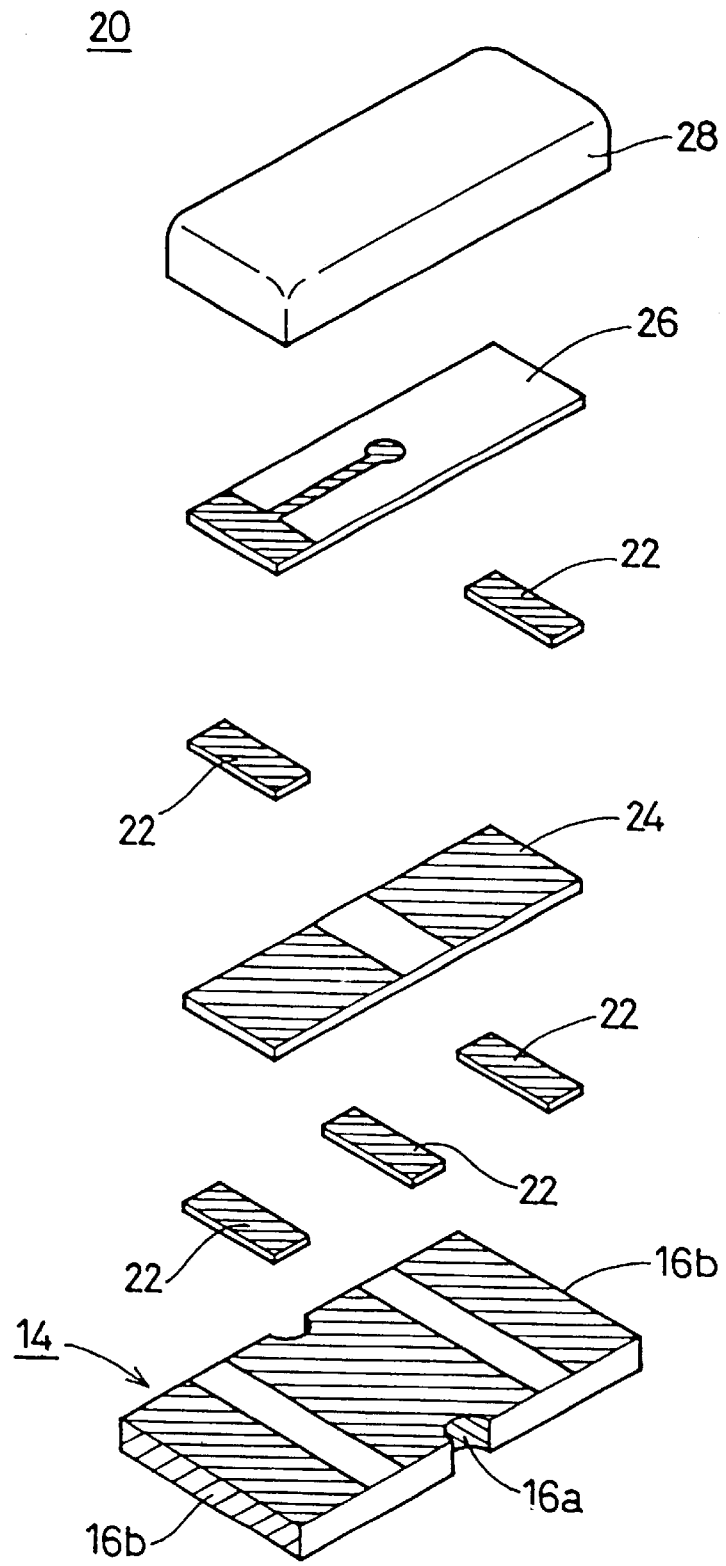
FIG. 4 is an exploded perspective view of an example of an electronic device using the substrate element shown in FIG. 2.

FIG. 4 is an exploded perspective view of an electronic device using the substrate element 14 shown in FIG. 2. An electronic device 20 shown in FIG. 4 is a built-in-load-capacitance-type surface-mounting resonator. The electronic device 20 includes the substrate element 14. The substrate element 14 is provided with a capacitor 24 fixed to the substrate element 14 through, for example, three first conductive chips 22. Electrodes provided on the bottom surface of the capacitor 24 are electrically connected to the side surface electrodes 16a and the end surface electrodes 16b of the substrate element 14 through the conductive chips 22 and electrodes disposed on the surface of the substrate element 14. The capacitor 24 is provided with a piezoelectric resonator 26 fixed thereto through, for example, two second conductive chips 22. Two electrodes of the piezoelectric resonator 26 are connected to two electrodes provided on the capacitor 24 through the second conductive chips 22. The piezoelectric resonator 26 is supported by the second conductive chips 22 at the vicinity of two ends thereof so that the vibration of the piezoelectric resonator 26 is not suppressed. The piezoelectric resonator 26 is covered by a cap 28.

Figure 5:
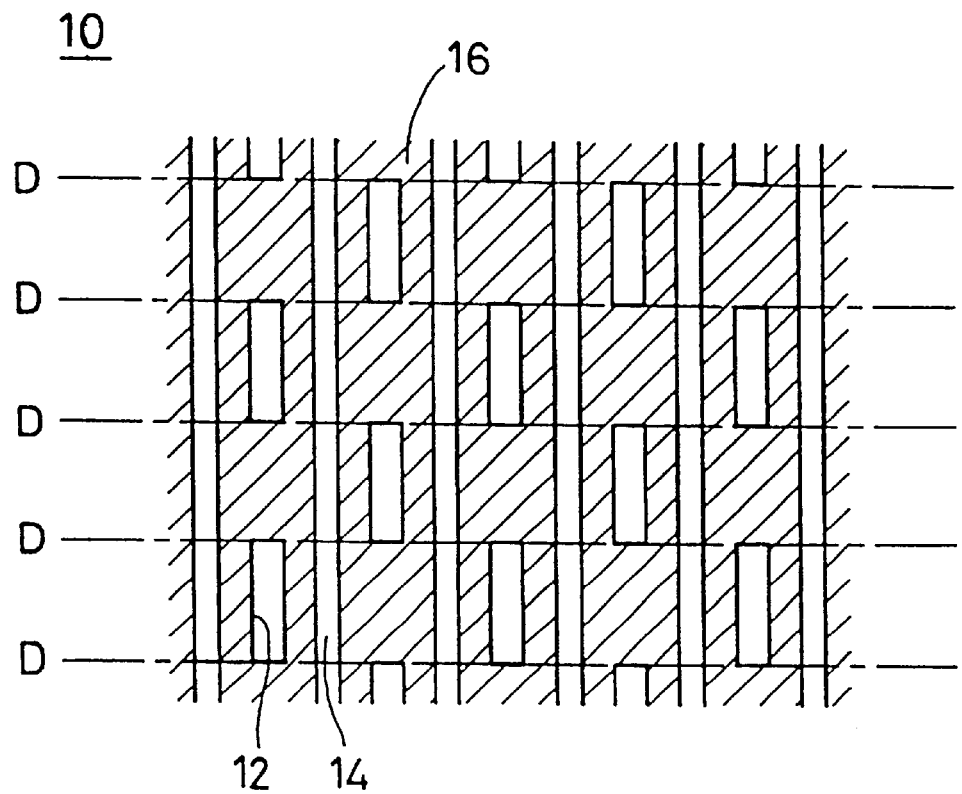
FIG. 5 is a plan view of a mother substrate according to a second preferred embodiment of the present invention.
Figure 6:
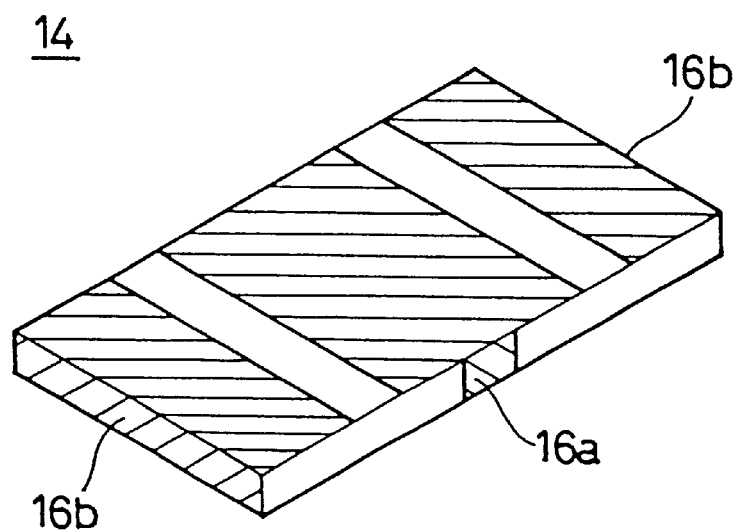
FIG. 6 is a perspective view of a substrate element obtained from the mother substrate shown in FIG. 5.

FIG. 5 is a plan view of a mother substrate according to a second preferred embodiment of the present invention. FIG. 6 is a perspective view of a substrate element obtained from the mother substrate shown in FIG. 5.

A mother substrate 10 shown in FIG. 5 includes through-holes having a shape different from that of the through-holes included in the mother substrate 10 shown in FIG. 1. Through-holes 12 of the mother substrate 10 shown in FIG. 5 are substantially formed in an elongated rectangle, and the inner surfaces of ends of each through-hole 12, which oppose each other in the longitudinal direction are flush with lateral surfaces of the substrate elements 14 adjacent to the through-hole 12. That is, intermediate parts of the lateral surfaces of each substrate element 14 are exposed, without recesses being provided therein, which are the inner surfaces of the longitudinal ends of the through-holes 12. The exposed parts are provided thereon with side surface electrodes 16a. The mother substrate 10 is cut along cut lines D which extend, along the lateral surfaces of the substrate elements 14, in a direction perpendicular to the longitudinal axis of the through-holes 12 so that the longitudinal ends of the through-holes 12 do not form recesses in the lateral surfaces of the substrate elements 14. With this arrangement, the substrate element 14 having no through-holes in the lateral surfaces thereof, as shown in FIG. 6, can be obtained from the mother substrate 10 shown in FIG. 5. Miniaturization of the substrate elements 14 having through-holes in the lateral surfaces thereof is limited because of the required strength of the material located around the through-holes. In contrast, the substrate element 14 having no cut-away through-holes, according to the present preferred embodiment can be further miniaturized.

Figure 7:
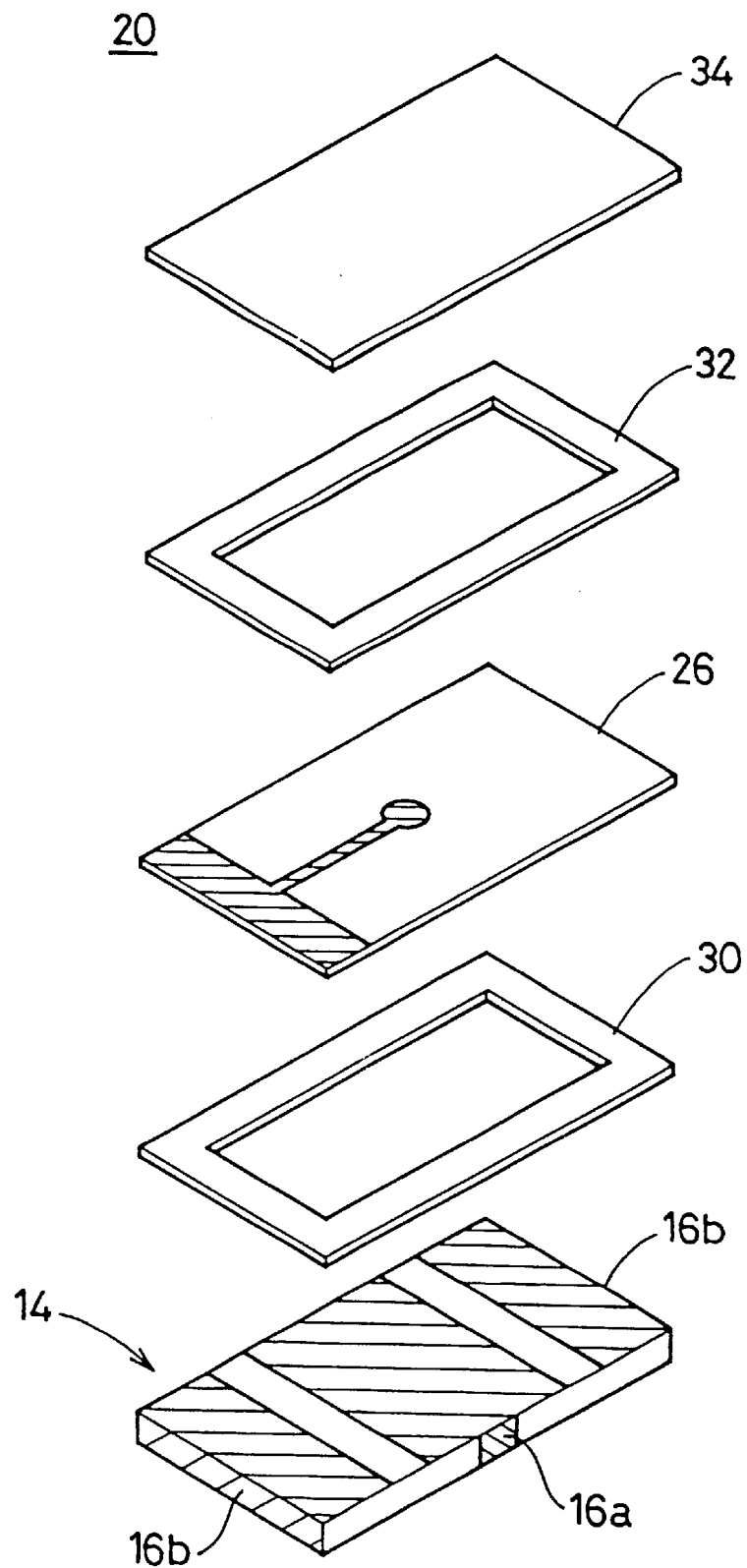
FIG. 7 is an exploded perspective view of an example of an electronic device using the substrate element shown in FIG. 6.

FIG. 7 is an exploded perspective view of an electronic device using the substrate element 14 shown in FIG. 6. An electronic device 20 shown in FIG. 7 includes the substrate element 14. The substrate element 14 in this case is made of a material having a high dielectric constant for providing load capacitance. The load capacitance is provided between the side surface electrodes 16a and end surface electrodes 16b. The substrate element 14 is provided thereon with a piezoelectric resonator 26 fixed thereto through an anisotropically conductive member 30 having, for example, a frame shape. The anisotropically conductive member 30 is conductive only in the thickness direction. One of the electrodes (not shown), which longitudinally oppose each other, provided on the bottom surface of the piezoelectric resonator 26 is electrically connected to one of the end surface electrodes 16b, which longitudinally oppose each other, provided on the substrate element 10. The other one of the electrodes, which longitudinally oppose each other, provided on the piezoelectric resonator 26 is electrically connected to the other one of the end surface electrodes 16b, which longitudinally oppose each other, provided on the substrate element 10. The piezoelectric resonator 26 is provided thereon with an upper substrate 34 fixed thereto through a frame-shaped adhesive 32 or other suitable joining member. The electronic device 20 is provided with spaces above and below the piezoelectric resonator 26 so as not to suppress the vibration of the piezoelectric resonator 26, the spaces being provided by the anisotropically conductive member 30 and the adhesive 32, which both preferably have a predetermined thickness and frame shape.

Figure 8:
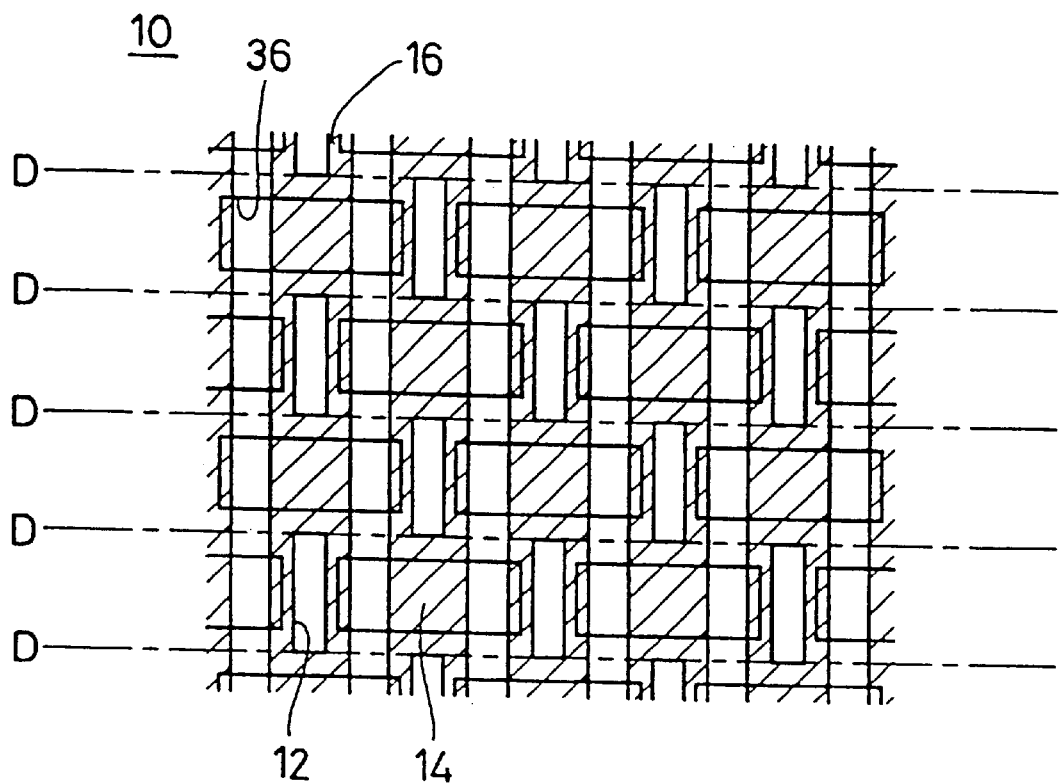
FIG. 8 is a plan view of a mother substrate according to a third preferred embodiment of the present invention.
Figure 9:
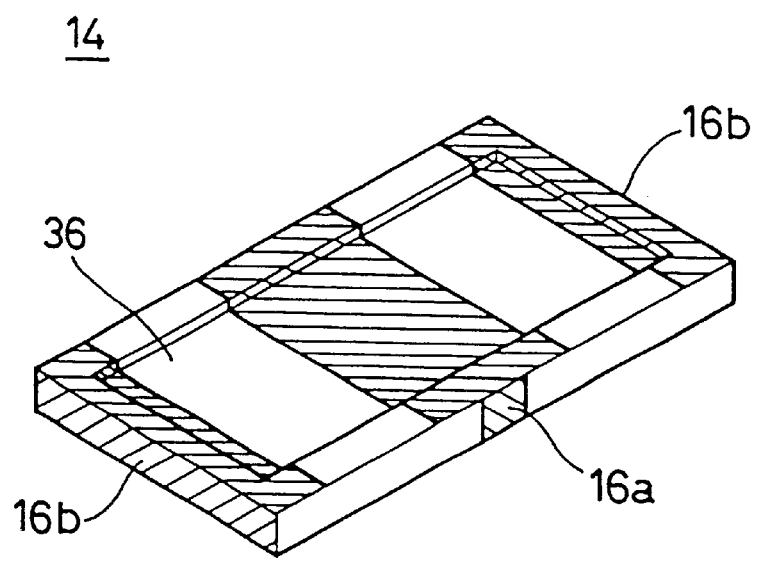
FIG. 9 is a perspective view of a substrate element obtained from the mother substrate shown in FIG. 8.

FIG. 8 is a plan view of a mother substrate according to a third preferred embodiment of the present invention. FIG. 9 is a substrate element obtained from the mother substrate shown in FIG. 8.

A mother substrate 10 shown in FIG. 8 is different from the mother substrate 10 shown in FIG. 5, in that the mother substrate 10 shown in FIG. 8 is provided with a recess 36, having a substantially rectangular shape in plan view, on the principal plane of each substrate element 14. The recess 36 is provided for receiving therein an electronic device such as a piezoelectric resonator 26 (see FIG. 10). The substrate element 14 shown in FIG. 9 is obtained from the mother substrate 10 shown in FIG. 8. The substrate element 14 can be widely used because it is provided with the recess 36 for receiving an electronic device.

Figure 10:
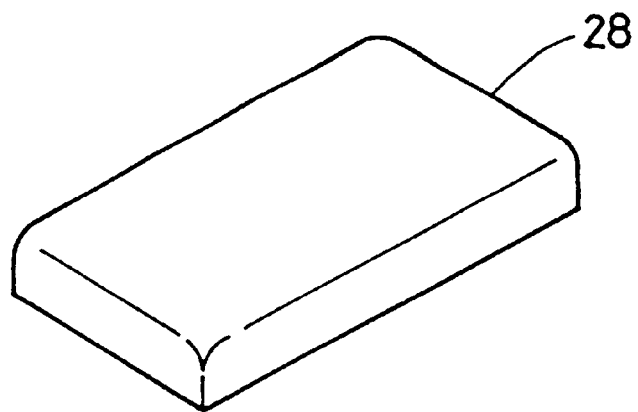
FIG. 10 is an exploded perspective view of an example of an electronic device using the substrate element shown in FIG. 9.
Figure 10:
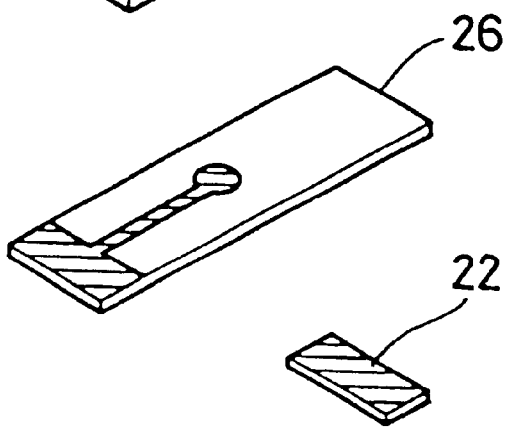
Figure 10:
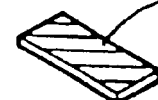
Figure 10:
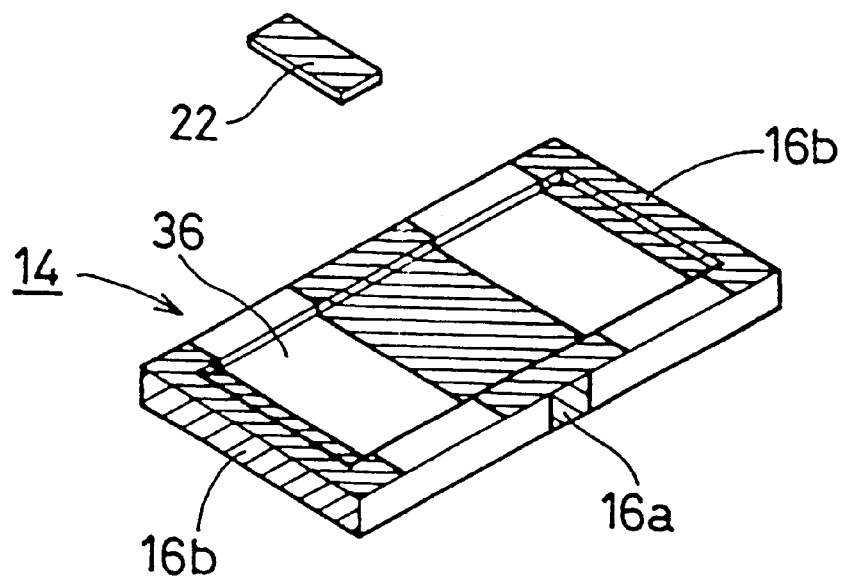

FIG. 10 is an exploded perspective view of an electronic device using the substrate element 14 shown in FIG. 9. An electronic device 20 shown in FIG. 10 includes the substrate element 14. The substrate element 14 in this case is made of a material having a high dielectric constant for providing load capacitance. The substrate element 14 includes the recess 36 on the principal plane thereof. Side surface electrodes 16a and end surface electrodes 16b are extended so as to be exposed in the recess 36. The piezoelectric resonator 26 is received in the recess 36 of the substrate element 14. Electrodes (not shown), which longitudinally oppose each other, provided on the bottom surface of the piezoelectric resonator 26 are connected to the corresponding end surface electrodes 16b, which longitudinally oppose each other, of the substrate element 10 through conductive chips 22. The piezoelectric resonator 26 and the recess 36 are covered by a cap 28. The electronic device 20 can be made thin because of the recess 36 provided on the principal plane of the substrate element 14, whereby projection from a circuit board can be reduced when the electronic device 20 is mounted on the circuit board.

Figure 11:
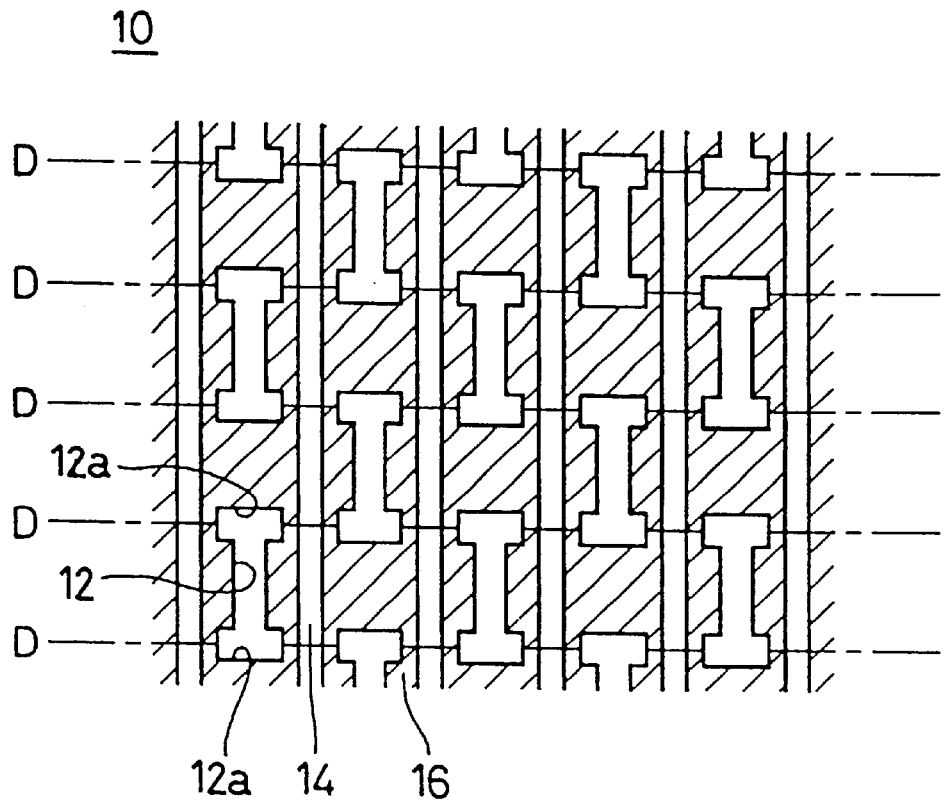
FIG. 11 is a plan view of the mother substrate shown in FIG. 1 including a modified example of the through-holes.
Figure 12:
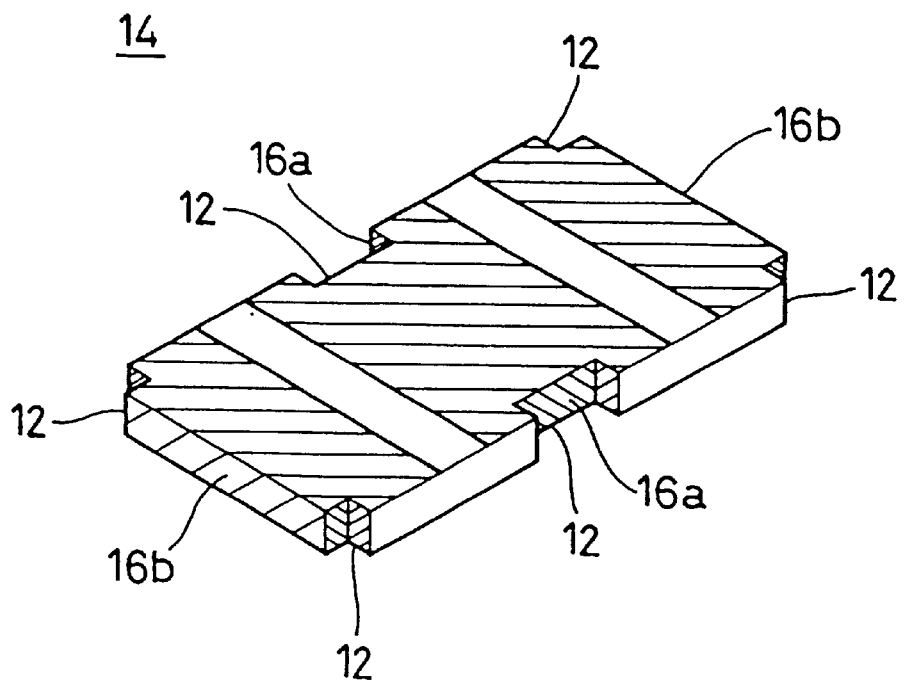
FIG. 12 is a perspective view of a substrate element obtained from the mother substrate shown in FIG. 11.

FIG. 11 is a plan view of a modified example of through-holes 12 provided in the mother substrate 10 shown in FIG. 1. FIG. 12 is a perspective view of a substrate element 14 obtained from a mother substrate 10 shown in FIG. 11. The mother substrate 10 shown in FIG. 11 is different from the mother substrate 10 shown in FIG. 1 in that the through-holes 12 have a shape of the letter H, as shown in FIG. 11. Each of the through-holes 12 of the mother substrate 10 shown in FIG. 11 has sections 12a at the longitudinal ends of the through-hole 12, the sections 12a extending perpendicularly to the longitudinal axis of the through-hole 12. Cut lines D extend along laterally intermediate lines of the sections 12a and extend along the lateral surfaces of the substrate elements 14. With this arrangement of the modified example, the substrate elements 14 can be obtained, in which each substrate element 14 preferably includes substantially U-shaped cut-away through-holes 12 in the lateral surfaces, which oppose each other in the width direction, and the through-holes 12 cut away in a shape of the letter L at the four corners of the substrate element 14.

Figure 13:
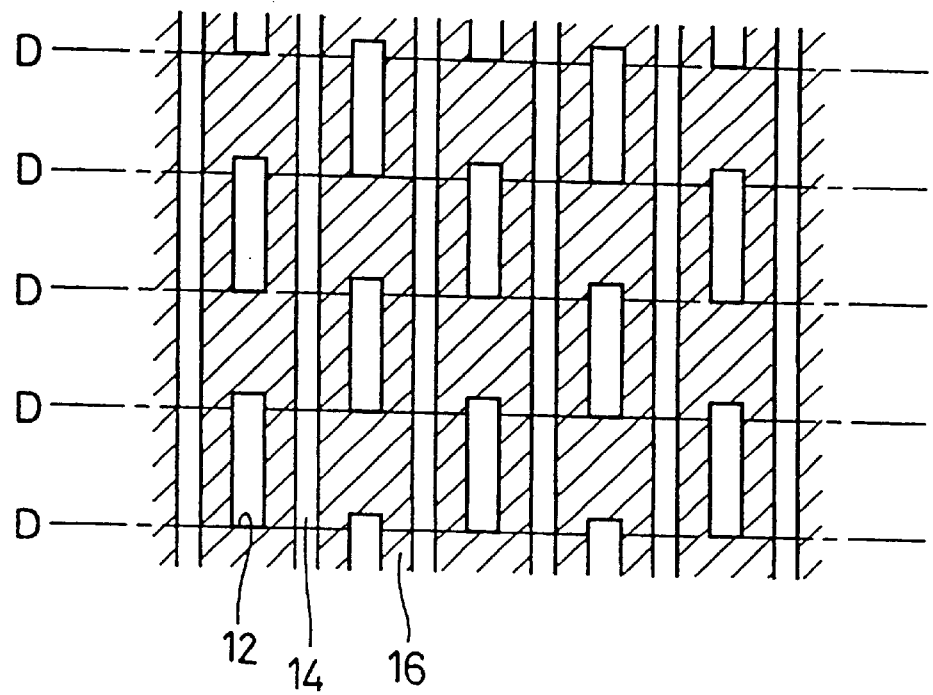
FIG. 13 is a plan view of the mother substrate shown in FIG. 1 including another modified example of the through-holes.
Figure 14:
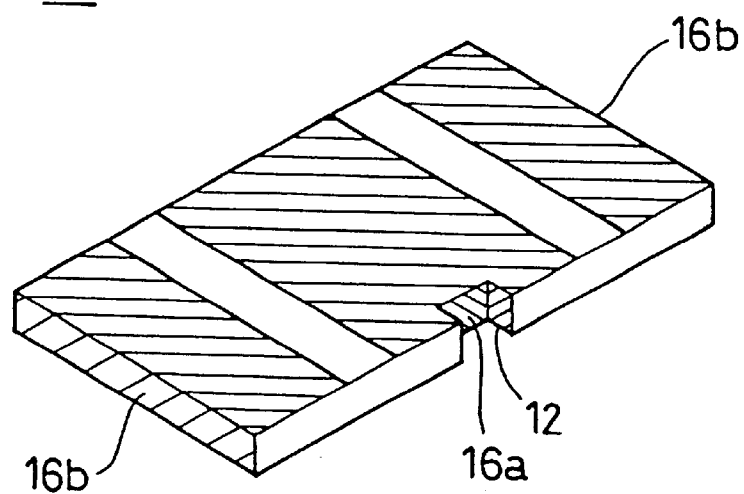
FIG. 14 is a perspective view of a substrate element obtained from the mother substrate shown in FIG. 13.

FIG. 13 is a plan view of another modified example of through-holes 12 of the mother substrate 10 shown in FIG. 1. FIG. 14 is a perspective view of a substrate element 14 obtained from the mother substrate 10 shown in FIG. 13. A mother substrate 10 shown in FIG. 13 includes the through-holes 12 having substantially an elongated rectangle configuration. One of the ends of each through-hole 12, which longitudinally oppose each other, defines a cut-away recess in a lateral surface of the adjacent substrate element 14, and the inner surface of the other longitudinal end is flush with a lateral surface of another substrate element 14 adjacent thereto. With this arrangement of the modified example, the substrate elements 14 can be obtained, in which each substrate element 14 has one through-hole 12, cut away in a substantially rectangular configuration in plan view, in one of the lateral surfaces of the substrate element 14, which oppose each other in the width direction.

The shape of the through-holes 12 of the mother substrate 10 is not limited to that which is shown in FIG. 13, and it may be modified according to the usage of the substrate element 14.

Figure 15:
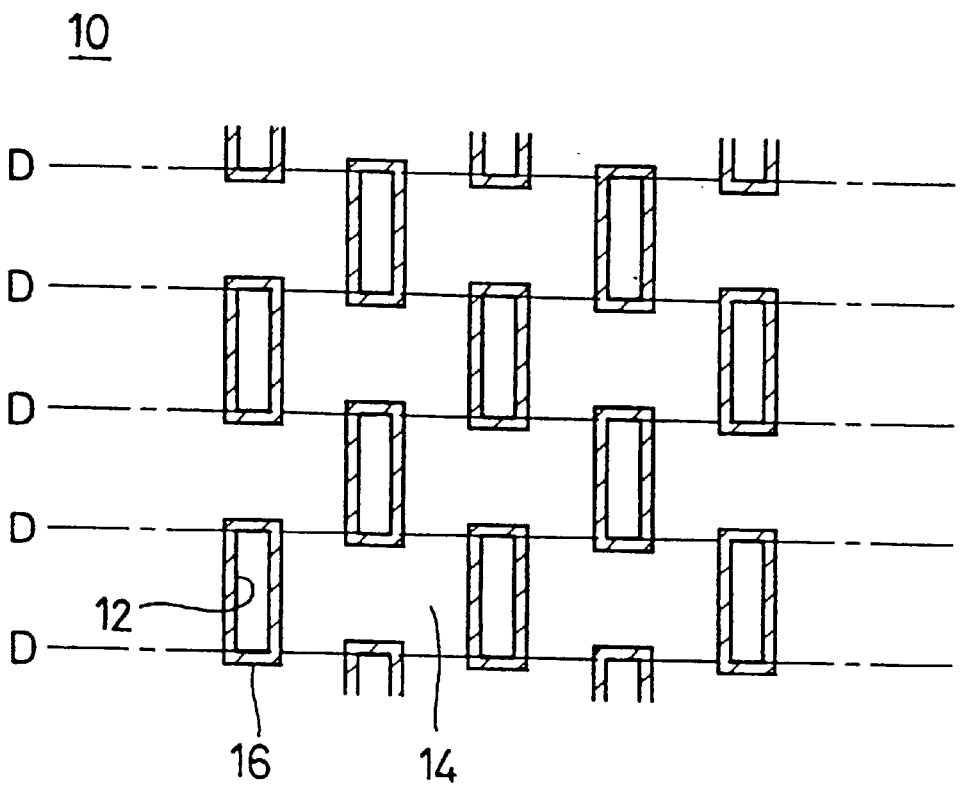
FIG. 15 is a plan view of a modified example of the electrode patterns of the mother substrate shown in FIG. 5.
Figure 16:
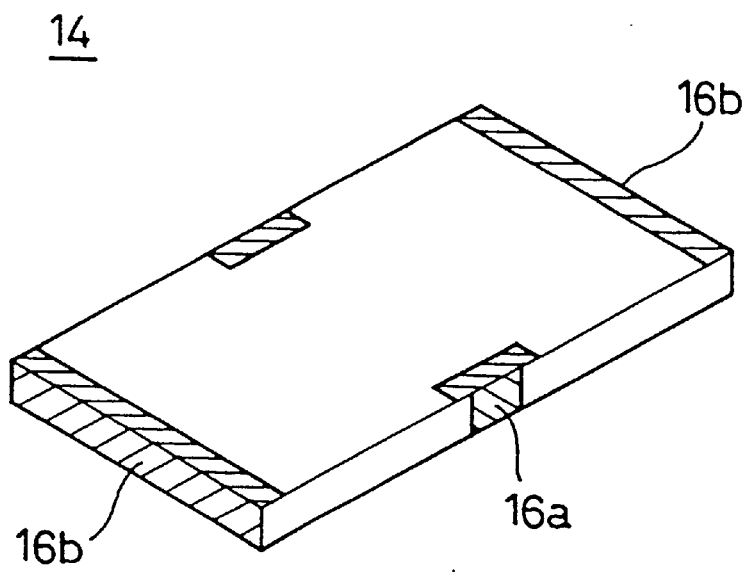
FIG. 16 is a perspective view of a substrate element obtained from the mother substrate shown in FIG. 15.

FIG. 15 is a plan view of a modified example of electrode patterns of the mother substrate 10 shown in FIG. 5. FIG. 16 is a perspective view of a substrate element 14 obtained from a mother substrate 10 shown in FIG. 15. The mother substrate 10 shown in FIG. 15 is different from the mother substrate 10 shown in FIG. 5 in that each through-hole 12 having a substantially elongated rectangular configuration, includes a frame-shaped electrode pattern 16 provided on and around the inner surfaces of the through-hole 12.

Figure 17:
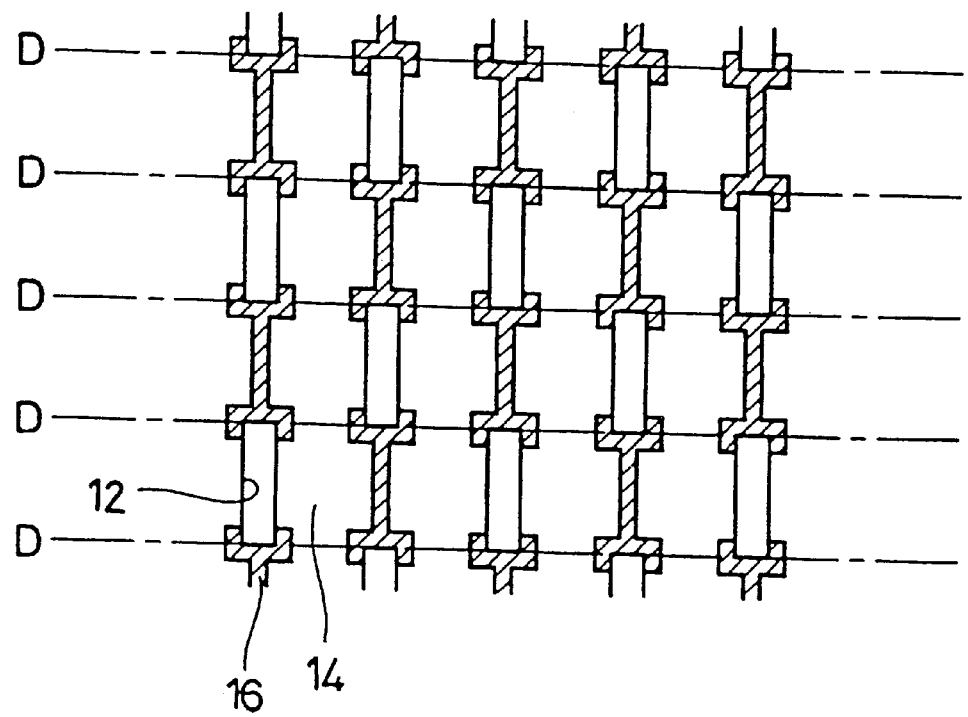
FIG. 17 is a plan view of another modified example of the electrode patterns of the mother substrate shown in FIG. 5.
Figure 18:
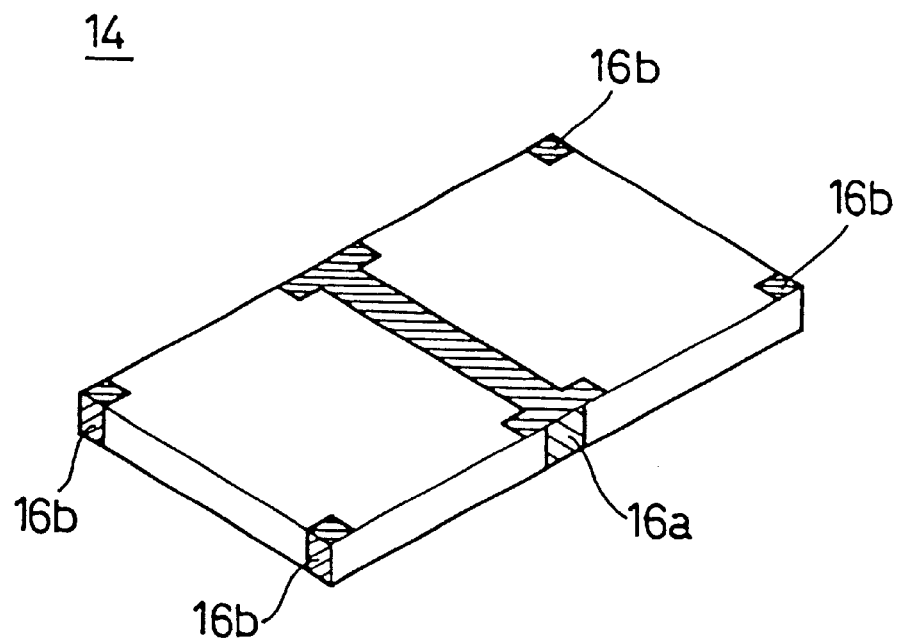
FIG. 18 is a perspective view of a substrate element obtained from the mother substrate shown in FIG. 17.

FIG. 17 is a plan view of another modified example of electrode patterns of the mother substrate 10 shown in FIG. 5. FIG. 18 is a perspective view of a substrate element 14 obtained from a mother substrate 10 shown in FIG. 17. The mother substrate 10 shown in FIG. 17 is different from the mother substrate 10 shown in FIG. 5 in that each substrate element 14 included in the mother substrate 10 shown in FIG. 17 is provided thereon with an electrode pattern 16 having substantially a shape of the letter H so that the electrode pattern 16 connects two through-holes 12 which oppose each other across the substrate element 14 in a width direction thereof.

As described above, the electrode patterns 16 may be formed in various ways according to the usage of the substrate element 14. The electrode patterns 16 may be formed either differently between the upper surface and the bottom surface of the substrate element 14, or in the same shape on the upper surface as that which is provided on the bottom surface of the substrate element 14.

Figure 19:
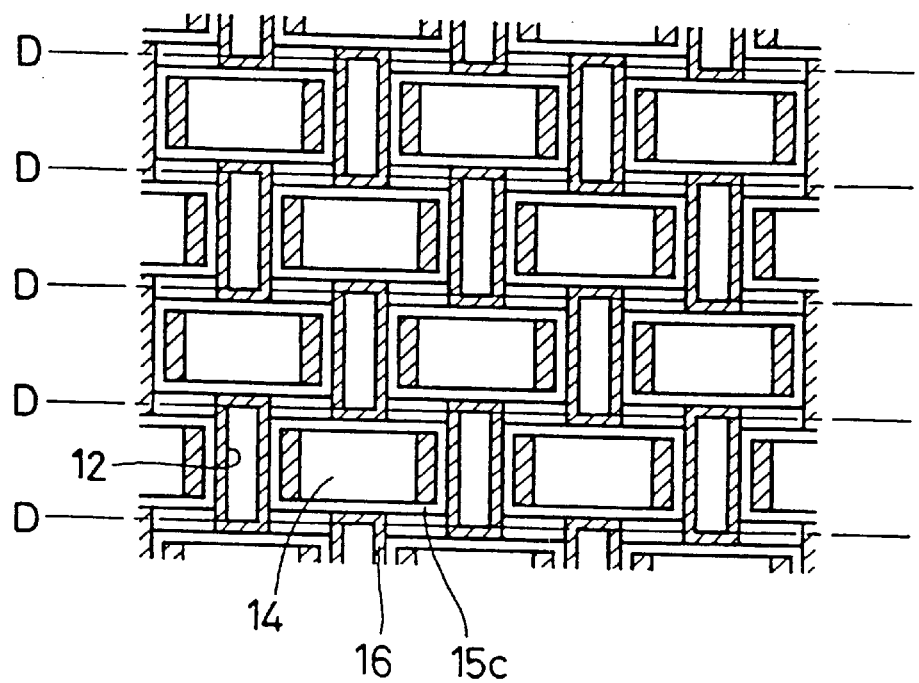
FIG. 19 is a plan view of a mother substrate according to a fourth preferred embodiment of the present invention.
Figure 20:
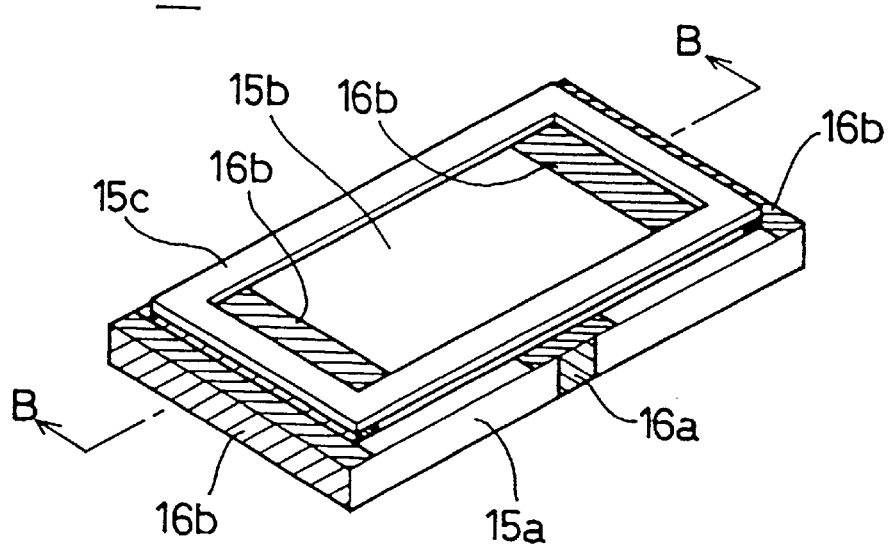
FIG. 20 is perspective view of a substrate element obtained from the mother substrate shown in FIG. 19.
Figure 21:
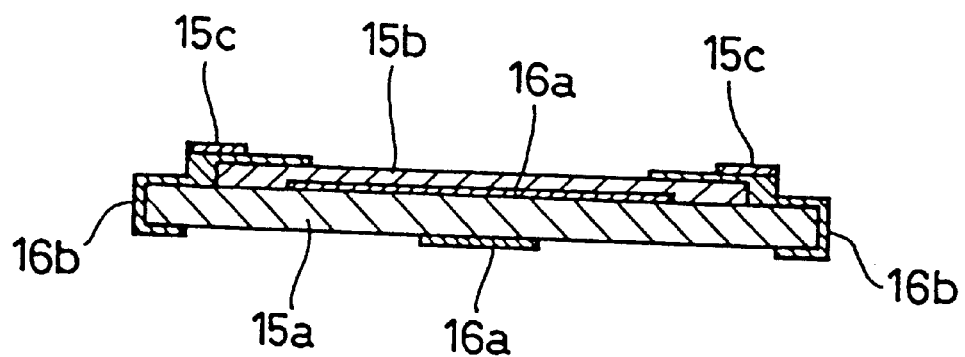
FIG. 21 is a longitudinal-sectional view, along the line B—B, of the substrate element shown in FIG. 20.
Figure 22:
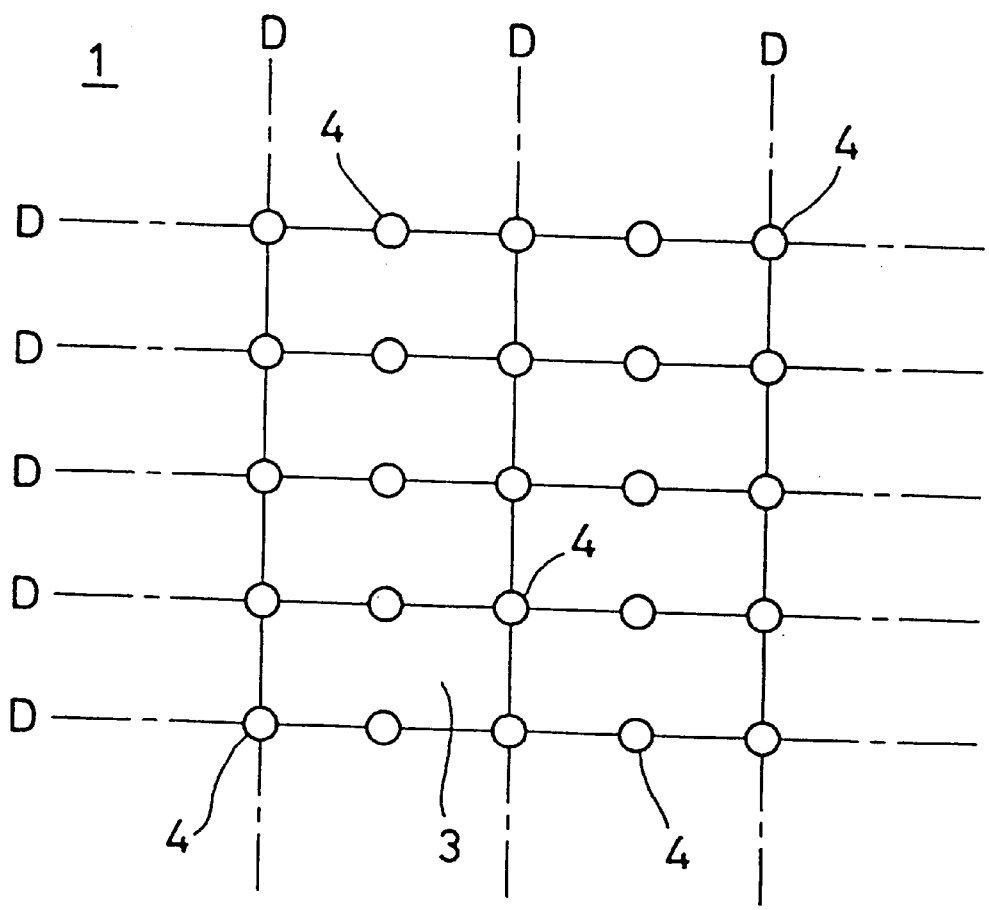
FIG. 22 is a plan view of a conventional mother substrate.
Figure 23:
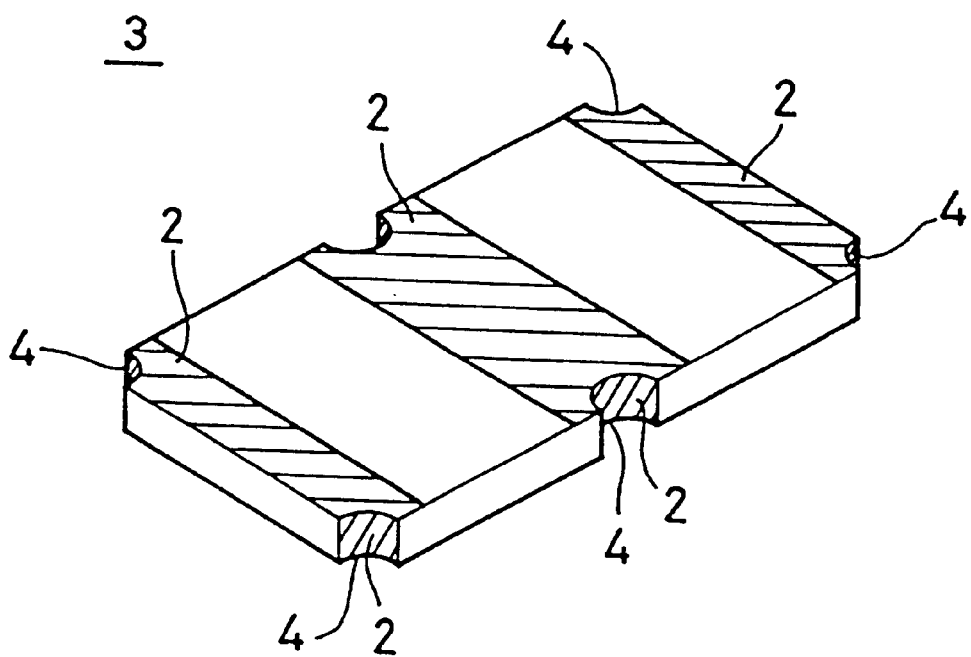
FIG. 23 is a perspective view of a substrate element obtained from the conventional mother substrate shown in FIG. 22.

FIG. 19 is a plan view of a mother substrate 10 according to a fourth preferred embodiment of the present invention. FIG. 20 is a perspective view of a substrate element 14 obtained from the mother substrate 10 shown in FIG. 19. FIG. 21 is a longitudinal-sectional view, along line B—B, of the substrate element 14 shown in FIG. 20.

The mother substrate 10 shown in FIG. 19 is different from the mother substrate 10 shown in FIG. 5 in that the mother substrate 10 shown in FIG. 19 includes the substrate elements 14 including a multi-layer substrate. The substrate element 14 shown in FIGS. 20 and 21 includes a first substrate 15a preferably made of a material having a low dielectric constant. The first substrate 15a includes a side surface electrode 16a, the ends thereof being disposed at intermediate portions of the lateral surfaces of the first substrate 15a. The side surface electrode 16a defines a band to be exposed at the upper surface and the bottom surface of the first substrate 15a. The first substrate 15a is provided with end surface electrodes 16b on the entire surfaces of the longitudinal ends of the first substrate 15a. The first substrate 15a is overlaid, via the side surface electrode 16a, with a substantially rectangular second substrate 15b which is made of a material having a high dielectric constant. The end surface electrodes 16b provided on the first substrate 15a are extended to be exposed at the upper and bottom surfaces of the first substrate 15a and at the upper surface of the second substrate 15b. The second substrate 15b is overlaid, via the end surface electrodes 16b, with a frame-shaped third substrate 15c which is made of a material having a low dielectric constant.

According to the fourth preferred embodiment, the substrate elements 14 are obtained from the mother substrate 10 overlaid with the first, second, and third substrates 15a, 15b, and 15c at the position of each substrate element 14 to be formed, then, the mother substrate 10 is cut into the substrate elements 14 along cut lines D, as shown in FIG. 19.

The substrate element 14 shown in FIGS. 20 and 21 is arranged to be overlaid with the first substrate 15a and the third substrate 15c of materials having low dielectric constants and the second substrate 15b of a material having a high dielectric constant, whereby an overall load capacitance is provided. The third substrate 15c included in the substrate element 14 shown in FIG. 21 has a frame shape, thereby providing a space for receiving an electronic device such as a piezoelectric resonator.

The present invention greatly improves the manufacturing processes and achieves significant reduction of the manufacturing cost of substrate elements. The mother substrate is provided with elongated through-holes arranged in a staggered configuration, in which the through-holes define common end surfaces of the adjacent substrate elements and define common through-holes of the other adjacent substrate elements, on which the end surface electrodes and the side surface electrodes are provided, whereby the number of through-holes in a mother substrate is greatly reduced, thereby reducing the manufacturing cost of mother substrates and substrate elements.

While it is difficult to cut a mother substrate into substrate elements by simply alternately disposing elongated through-holes and the substrate elements, each elongated through-hole according to preferred embodiments of the present invention defines longitudinal end surfaces of the adjacent two substrate elements, whereby a process of cutting the longitudinal ends of substrate elements can be omitted. The substrate elements can be separated from each other by cutting the mother substrate along cut lines extending in one direction that is substantially perpendicular to the longitudinal axis of the elongated through-holes, thereby reducing the number of processes compared to a known method.

According to the present invention, substrate elements can be obtained which do not have cut-away parts in the lateral surfaces formed by through-holes. Accordingly, the substrate elements can be miniaturized further.

The through-holes and the electrode patterns may having various shapes determined according to the usage of substrate elements. For example, the substrate elements may be provided with projections and recesses, and may include a multi-layer substrate. With these arrangements, substrate elements capable of a variety of uses can be provided.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A mother substrate for forming a plurality of substrate elements, comprising:
   a main body including lateral surfaces and longitudinal surfaces;
   a plurality of electrodes on the lateral surfaces and the longitudinal end surfaces of the main body; and
   a region in which the plurality of substrate elements including a first substrate element and a second substrate element are provided, the region including at least one elongated through-hole, said elongated through-hole arranged on said region such that an entire longitudinal end surface of the first substrate element and a portion of a lateral surface of the second substrate element are exposed.

2. The mother substrate of claim 1, wherein an inner surface of said at least one elongated through-hole is provided with an electrode pattern to define an end surface electrode of the first substrate element and to define a side surface electrode of the second substrate element.

3. The mother substrate according to claim 2, wherein said inner surface of said longitudinal end of said at least one elongated through-hole is flush with said lateral surface of the second substrate element and with said inner surface provided with said side surface electrode.

4. The mother substrate according to claim 1, wherein a recess is provided in said lateral surface of said second substrate element.

5. The mother substrate according to claim 1, further comprising an electrode pattern disposed substantially around said at least one elongated through-hole on a principal surface of said mother substrate.

6. The mother substrate according to claim 1, wherein said at least one elongated through-hole comprises first and second through-holes, and further comprises an electrode pattern disposed on a principal surface of said mother substrate such that said electrode pattern substantially connects said first and second through-holes.

7. The mother substrate according to claim 1, further comprising at least one other substrate overlaid on said region.

8. The mother substrate according to claim 1, wherein said longitudinal end surface and said lateral surface of said first and second substrate elements, respectively, have recessed portions.

9. The mother substrate according to claim 1, wherein said region has at least one recessed area.

10. The mother substrate according to claim 1, wherein said first and second substrate elements have a common lateral surface.

11. A method of manufacturing a plurality of substrate elements from a mother substrate, the method comprising the steps of:

providing a mother substrate including at least a first substrate element and a second substrate element;

forming at least one elongated through-hole such that an entire longitudinal end surface of the first substrate element and a portion of a lateral surface of the second substrate element are exposed;

forming an electrode pattern on an inner surface of said at least one elongated through-hole; and cutting said mother substrate along lines extending in the vicinity of longitudinal ends of said at least one elongated through-hole and in a direction that is substantially perpendicular to the longitudinal axis of said at least one elongated through-hole.

12. The method according to claim 11, wherein said step of forming said elongated through-hole includes forming said inner surface of said longitudinal end to be flush with said lateral surface of the second substrate element.

13. The method according to claim 11, wherein said step of forming at least one elongated through-hole includes forming a recess in said lateral surface of said second substrate element.

14. The method according to claim 11, wherein said step of forming said electrode pattern includes forming an electrode pattern substantially around said at least one elongated through-hole on a principal surface of said mother substrate.

15. The method according to claim 11, wherein said step of forming at least one elongated through-hole comprises forming first and second through-holes, and said step of forming said electrode pattern includes forming said electrode pattern on a principal surface of said mother substrate, and connecting said first and second through-holes with said electrode pattern.

16. The method according to claim 11, further comprising providing at least one other substrate overlaid on said mother substrate.

17. The method according to claim 11, further comprising forming recessed portions in said longitudinal end surface and said lateral surface of said first and second substrate elements, respectively.

18. The method according to claim 11, further comprising forming at least one recessed area on a principal surface of said mother substrate.

19. The method according to claim 11, further comprising arranging said first and second substrate elements to be adjacent to each other such that said first and second substrate elements have a common lateral surface.

20. A method of manufacturing an electronic device comprising the steps of:

providing a mother substrate having a plurality of substrate elements including at least a first substrate element and a second substrate element;

forming at least one elongated through-hole on said mother substrate such that an entire longitudinal end surface of the first substrate element and a portion of a lateral surface of the second substrate element are exposed, the first and the second substrate elements being adjacent to each other and having a common lateral surface thereof;

forming an electrode on an inner surface of said at least one elongated through-hole to define an end surface electrode of the first substrate element and to define a side surface electrode of the second substrate element;

cutting said mother substrate along lines extending in a vicinity of the longitudinal ends of said at least one elongated through-hole and in a direction that is substantially perpendicular to the longitudinal axis of said at least one elongated through-hole, so as to form a completed substrate element; and mounting an electronic device element on said completed substrate element.

* * * * *